United States Patent [19]

Dias

[11] Patent Number: 4,978,869
[45] Date of Patent: Dec. 18, 1990

[54] ESD RESISTANT LATCH CIRCUIT
[75] Inventor: Donald R. Dias, Carrollton, Tex.
[73] Assignee: Dallas Semiconductor Corporation, Dallas, Tex.
[21] Appl. No.: 511,874
[22] Filed: Apr. 19, 1990

Related U.S. Application Data

[63] Continuation of Ser. No. 163,280, Mar. 2, 1988, abandoned.

[51] Int. Cl.$^5$ .................. H03K 17/16; H03K 3/26
[52] U.S. Cl. .................. 307/443; 307/572; 307/303; 307/289
[58] Field of Search .............. 307/147, 441, 148, 303, 307/572, 443, 219, 289; 357/40

[56] References Cited

U.S. PATENT DOCUMENTS

| | | | |
|---|---|---|---|
| 3,170,071 | 2/1965 | Griesmer et al. | 307/441 |
| 3,860,831 | 1/1975 | Goser | 307/441 |
| 4,213,064 | 7/1980 | Nagano | 307/219 |
| 4,739,378 | 4/1988 | Ferrari et al. | 357/40 |

OTHER PUBLICATIONS

"Improved COS/MOS Inverter Circuit for Reducing Burn-Out and Latch-Up", RCA Technical Notes, Jul. 1979 by Andrew Dingwall.
"COS/MOS Electrostatic Discharge Protection Network" by Pujol, Electronic Technology, vol. 13, Feb. 1979.

Primary Examiner—Stanley D. Miller
Assistant Examiner—Richard Roseen
Attorney, Agent, or Firm—Worsham, Forsythe, Sampels & Wooldridge

[57] ABSTRACT

A latch circuit which is resistant to electrostatic discharge includes four cross-coupled NOR gate pairs located in the four corners of an integrated circuit chip, and a fifth cross-coupled NOR gate pair positioned generally in the center of the integrated circuit chip. The Q outputs, the Q outputs, the reset inputs, and the set inputs of each of the five cross-coupled NOR gate pairs are connected together such that a single cross-coupled NOR gate pair receiving an electrostatic discharge will be held in its present state by the action of the other four cross coupled NOR gate pairs which will either supply current or sink current in order to maintain the state of the Q and Q-bar outputs.

23 Claims, 3 Drawing Sheets

ESD RESISTANT LATCH CIRCUIT

This is a continuation of application Ser. No. 163,280, filed Mar. 2, 1988, now abandoned.

REFERENCE TO OTHER APPLICATION

Reference is made to a first commonly owned application entitled "ELECTRONIC KEY LOCKING CIRCUITRY; (Attorney Docket No. 2846-18) Ser. No. 163,281 filed 03/02/88, now U.S. Pat. No. 4,970,401 in the name of Lee, Robert D. et al. to a second commonly owned application entitled "FUSING AND DETECTION CIRCUIT", (Attorney Docket No. 2846-16), Ser. No. 163,082 filed 03/02/88 now U.S. Pat. No. 4,935,645, in the name of Lee, Robert D.; to a third commonly owned application entitled "PROGRAMMABLE TIME BASE CIRCUIT WITH PROTECTED INTERNAL CALIBRATION", (Attorney Docket No. 2846-17), Ser. No. 163,279 now U.S. Pat. No. 4,897,860 filed 03/02/88, in the name of Dias, Donald R.; and to a fourth commonly owned application entitled "RANDOM NUMBER GENERATOR", (Attorney Docket No. 2846-13), Ser. No. 83,583, filed 08/10/88 in the name of Dias, Donald R.

TECHNICAL FIELD

This invention relates to logic circuits, and more particularly, to the interconnection of logic circuits.

BACKGROUND OF THE INVENTION

In the patent referred to above entitled "ELECTRONIC KEY LOCKING CIRCUITRY," Lee, Robert D. et al., there is described an electronic key which provides access to an internal random access memory upon receipt of a valid password. Included within one embodiment of this electronic key is an R-S flip-flop circuit which, when set, locks out certain commands that set the length of time of a time-out circuit within the electronic key. After the time-out circuit has timed out, the electronic key ceases to provide certain functions such as enabling data to be written into the random access memory. The end user, in order to avoid the time-out function, might try to reset the R-S flip-flop circuit by the application of an electrostatic discharge to one or more pins of the integrated circuit. There are also other conditions which can give rise to electrostatic discharge on the pins of an integrated circuit which would tend to disrupt data stored in a logic circuit.

It can, therefore, be appreciated that a R-S flip-flop circuit which is resistant to electrostatic discharge is highly desirable.

SUMMARY OF THE INVENTION

It is, therefore, an object of this invention to provide a latch circuit which is resistant to electrostatic discharge.

As shown in an illustrated embodiment of the invention, a latch circuit consists of a plurality of bistable multivibrator circuits. Each of the multivibrator circuits has an output terminal, and each of these output terminals are coupled together.

Also shown in an illustrated embodiment of the invention is a method to provide a storage circuit which is resistant to electrostatic discharge by first placing each of a plurality of the latch circuits at a location remote from each other on an integrated circuit chip. Second, an output terminal of each of the latch circuits is connected together.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
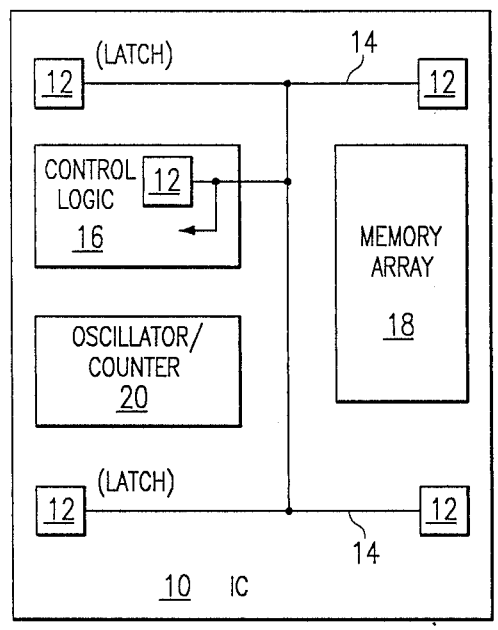
FIG. 1 is a layout diagram of an integrated circuit containing a latch circuit interconnected according to the present invention.

It will be appreciated that for purposes of clarity and where deemed appropriate, reference numerals have been repeated in the figures to indicate corresponding features and that the elements of the integrated circuit shown in FIG. 1 have not been drawn to scale.

DESCRIPTION OF THE PREFERRED EMBODIMENT

Electrostatic discharge (ESD) onto a pin of an integrated circuit induces a large number of electrons or holes onto the integrated circuit chip in the vicinity of the pin. If the ESD is large enough, data stored in memory cells or in latches in the vicinity of the pin can be inverted by the ESD.

The present invention provides a latch which is highly resistant to ESD. In the preferred embodiment, an ESD resistant latch or R-S flip-flop is comprised of four cross-coupled NOR gate pairs are placed near the four corners of an integrated circuit chip and a fifth cross-coupled NOR gate pair placed generally in the center of the chip. The Q and $\bar{Q}$ outputs from each of the five sets of cross-coupled NOR gate pairs are connected together as are the set and reset inputs to the five sets of cross-coupled NOR gate pairs. When an ESD is applied to one of the pins of the integrated circuit that is large enough to invert the status of a single cross-coupled NOR gate pair, the other four sets of cross-coupled NOR gate pairs will provide sufficient current sinking or sourcing to absorb the holes or electrons produced by the ESD and thus preserve the state stored in the five sets of cross-coupled NOR gate pairs.

Turning now to the drawings, FIG. 1 is a layout diagram of an integrated circuit chip 10 which contains five sets of bistable multivibrators consisting of cross-coupled NOR gate pairs 12 in the preferred embodiment. As shown in FIG. 1, each of four of the cross-coupled NOR gate pairs 12 is located at each of the four corners of the integrated circuit chip 10, and the fifth cross-coupled NOR gate pair 12 is located inside a control logic block 16. A bus line 14 connects together the five sets of cross-coupled NOR gate pairs and is also connected to circuitry inside the control logic block 16 which is located approximately in the center of the integrated circuit chip 10. Located to the right of the control logic block 16 is a memory array 18. Located below the control logic block 16 is an oscillator and counter circuit 20 which contains storage registers holding the data bits which determine the length of the time-out counter and also contains storage registers holding calibration data for the time-out oscillator and counter. Thus each of the cross-coupled NOR gate pairs 12 are in a location remote from each of the other cross-coupled NOR gate pairs 12.

Figure 2:
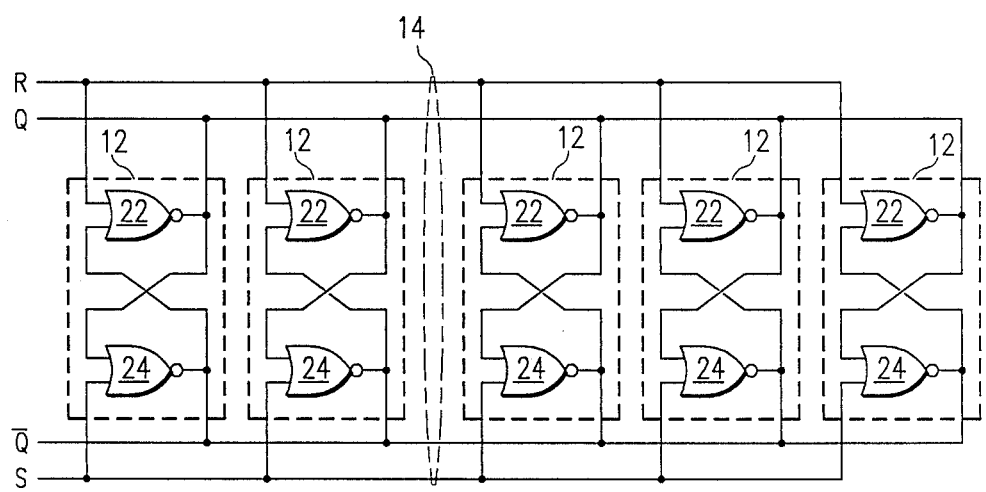
FIG. 2 is a logic diagram of the latch circuits and the interconnections of the latch circuits shown in FIG. 1.

Turning now to FIG. 2, the five sets of cross-coupled NOR gate pairs 12 are shown together with the four lines which make up the bus 14. As can be seen from FIG. 2 each of the cross-coupled NOR gate pairs 12 consists of an upper NOR gate 22 and a lower NOR gate 24, and each of the Q and Q outputs of the five sets of cross-coupled NOR gate pairs 12 are connected together as is each of the R or reset inputs and each of the S or set inputs.

Figure 3:
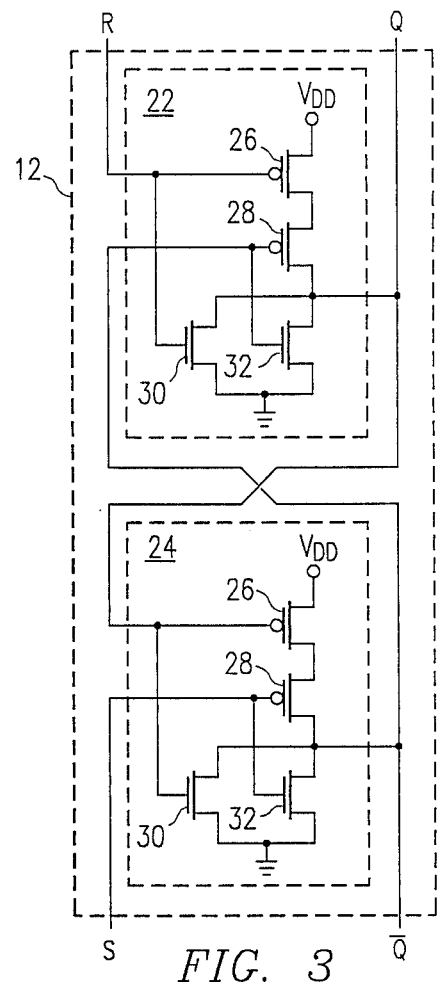
FIG. 3 is a schematic diagram of one of the latch circuits shown in FIG. 2.

Turning now to FIG. 3, one set of the cross-coupled NOR gate pairs 12 is shown in schematic detail. Each of the NOR gates 22 and 24 includes an upper p-channel transistor 26 in series with a second p-channel transistor 28, the drain of this p-channel transistor 28 performing the output terminal of the NOR gate. Coupled between the output terminal of the NOR gate and ground are two n-channel transistors connected in parallel. The first n-channel transistor 30 has its gate connected to the gate of the upper p-channel transistor 26 to form a first input terminal of the NOR gates 22 and 24, and the second n-channel transistor 32 has its gate connected to the gate of the lower p-channel transistor 28 to form a second input terminal of the NOR gates 22 and 24. In the upper NOR gate 22, this first input terminal is connected to the reset input of the bus line 14 and the second input is connected to the output of the NOR gate 24 which in turn is connected to the Q line of the bus 14. In the lower NOR gate 24 the first input is connected to the output of the NOR gate 22 which in turn is connected to the Q line of the bus 14, and the second input is connected to the set input of the bus 14.

When used in the electronic key, the reset and set lines are both normally at a logic 0 level except when the R-S flip-flop circuit (consisting of the five sets of NOR gate pairs 12 and the bus 14), is either being set or reset. If, for example, the R-S flip-flop circuit is in the set condition, then the Q line on the data bus 14 is at a logic 1 level. In this condition the upper p-channel transistors 26 and 28 of the NOR gate 22 will be conductive and n-channel transistors 30 and 32 will be nonconductive; while the upper p-channel transistor 26 of the NOR gate 24 will be nonconductive and the n-channel transistor 30 will be conductive, thus providing a logic 0 level on the Q line.

If one of the five sets of cross-coupled NOR gate pairs 12 were to receive an electrostatic discharge of electrons, then the output terminal of the upper NOR gate 22, which is at a logic 1 voltage, would attract a large number of electrons which would tend to decrease the voltage at the output terminal of the logic gate 22. If the cross-coupled NOR gate 12 receiving the ESD was not connected to the other four cross-coupled NOR gates 12, and if enough electrons are injected into the output terminal of the NOR gate 22, the output of the NOR gate 22 could switch to a logic 0 level which in turn would switch the output of the NOR gate 24 to a logic 1 level. However, as the voltage at the output of the NOR gate 22 on the Q line of the data bus 14 begins to be pulled down by the electrons from the electrostatic discharge, the other four sets of cross-coupled NOR gate pairs 12, which are remote from the cross-coupled NOR gate 12 directly affected by the ESD, will supply the current necessary to compensate for these extra electrons.

The above-described invention provides an increased margin of resistance to electrostatic discharge compared to a single latch circuit which has large transistor geometries since a large transistor also tends to attract more electrons or holes than a smaller transistor device. The present invention avoids this problem by locating the individual sets of cross-coupled NOR gate pairs 12 at locations remote from each other so that a single electrostatic discharge affects only one of the five sets of the cross-coupled NOR gate pairs 12.

As shown in FIG. 1, one of the cross-coupled NOR gate pairs 12 is located in the central portion of the integrated circuit chip 10. Thus, a person trying to invert the status of the five sets of cross-coupled NOR gate pairs 12 would have to provide sufficient electrostatic discharge energy to not only invert the cross-coupled NOR gate pairs 12, but also to invert at least some of the data stored in the memory array 18 or in the calibration circuitry in the oscillator and counter circuit 20.

The above-described invention, therefore, provides a data latch which is highly resistant to electrostatic discharge and further thwarts efforts by a person attempting to invert the status of the cross-coupled NOR gate pairs 12 by locating at least one of the cross-coupled NOR gate pairs 12 near data stored on the integrated circuit chip.

Although the invention has been described in part by making detailed reference to a certain specific embodiment, such detail is intended to be and will be understood to be instructional rather than restrictive. It will be appreciated by those skilled in the art that many variations may be made in the structure and mode of operation without departing from the scope and spirit of the invention, as disclosed in the teachings contained herein. For example an ESD resistant latch according to the present invention may be used with virtually any type of bistable multivibrator circuit such as cross-coupled NAND gates, D latches, and other circuits such as a pair of inverter circuits placed in series. In this circuit the output of the last inverter is coupled through a transmission gate to the input of the first inverter with a second transmission gate coupling an input signal to the input of the first inverter, the two transmission gates operating in a complementary manner such that only one transmission gate is conductive at any one time.

What is claimed is:
1. A latch circuit comprising:
   a plurality of bistable multivibrator circuits,
      operatively connected to always have a shared instantaneous logic state during times when the circuit is in a stable non-transient condition,
      each said multivibrator circuit having a respective input terminal;
      each said multivibrator circuit having a respective output terminal;
   wherein multiple ones of said bistable multivibrator circuits are located in respective mutually remote locations including at least two different corners of a common integrated circuit chip;
   wherein all of said input terminals are coupled together;
   wherein all of said output terminals are coupled together.
2. The circuit of claim 1, wherein all of said data output terminals are directly connected together.
3. A latch circuit, comprising:
   a plurality of bistable multivibrator circuits, each having a respective output terminal;

wherein said output terminals of all of said bistable circuits are coupled together;
wherein each of said bistable multivibrator circuits has a set input terminal and a reset input terminal,
wherein multiple ones of said bistable multivibrator circuits are located in respective mutually remote locations including at least two different corners of a common integrated circuit chip;
and wherein all of said set input terminals are coupled together and all of said reset input terminals are coupled together.

4. The circuit of claim 3, wherein each of said bistable multivibrator circuits has a second output terminal, and wherein all of said second output terminals are coupled together.

5. A latch circuit, comprising:
a plurality of bistable multivibrator circuits, each having a first respective output terminal;
wherein said first output terminals of all of said bistable circuits are coupled together;
wherein multiple ones of said bistable multivibrator circuits are located in respective mutually remote locations including at least two different corners of a common integrated circuit chip;
wherein each of said bistable multivibrator circuits also has a second output terminal,
and wherein all of said second output terminals are coupled together.

6. A latch circuit comprising:
a plurality of bistable multivibrator circuits, each having a respective output terminal;
wherein all of said output terminals are coupled together; and
wherein all of said bistable multivibrator circuits are located in respective mutually remote locations including at least two different corners of an integrated circuit chip.

7. The circuit of claim 6, wherein at least one of said plurality of bistable multivibrator circuits is located on an integrated circuit chip in the vicinity of a data storage circuit.

8. A latch circuit comprising:
a plurality of bistable multivibrator circuits, each having a respective output terminal;
wherein all of said output terminals are coupled together; and
wherein multiple ones of said bistable multivibrator circuits are located in respective mutually remote locations including at least two different corners of a common integrated circuit chip;
wherein at least one of said plurality of bistable multivibrator circuits is located on an integrated circuit chip in the vicinity of a data storage circuit.

9. A method to provide a storage circuit which is resistant to electrostatic discharge, comprising the steps of:
(a) placing each of a plurality of bistable circuits within a single integrated circuit, at a location remote from each of the other of said bistable circuits, ones of said mutually remote locations including at least two different corners of said integrated circuit; and
(b) coupling together an output terminal of all of said bistable circuits.

10. A circuit for storing a lock signal status on an integrated circuit chip, comprising:

(a) a plurality of bistable circuits, each bistable circuit having a set input terminal, a reset input terminal, a Q output terminal, and a Q-bar output terminal;
(b) first conduction means for connecting all of said set input terminals together;
(c) second conduction means for connecting all of said reset input terminals together;
(d) third conduction means for connecting all of said Q output terminals together;
(e) fourth conduction mans for connecting all of said Q-bar output terminals together;
(f) wherein all of said bistable circuits are located in respective mutually remote locations including at least two different corners of on said integrated circuit chip; and
(g) wherein at least one of said bistable circuits is located near a data storage circuit.

11. A circuit, comprising:
a plurality of bistable multivibrator circuits,
each said multivibrator circuit having at least one respective data input terminal and at least one respective data output terminal;
wherein said data input terminals of all of said multivibrator circuits are coupled together;
wherein said data output terminals of all of said multivibrator circuits are coupled together; and
wherein all of said bistable multivibrator circuits are located in respective mutually remote locations including at least two different corners of a single integrated circuit.

12. The circuit of claim 11, wherein each of said bistable multivibrator circuits has both first and second data input terminals, and wherein all of said first input terminals are coupled together and all of said second input terminals are coupled together.

13. The circuit of claim 12, wherein said first data input terminal, of each of said bistable multivibrator circuits, is a set input terminal, and wherein said second input terminal, of each of said multivibrator circuits, is a reset input terminal.

14. The circuit of claim 11, wherein each of said bistable multivibrator circuits also has a second output terminal, and wherein all of said second output terminals are coupled together.

15. The circuit of claim 11, wherein at least one of said plurality of bistable multivibrator circuits is located on said integrated circuit chip in the vicinity of a data storage circuit.

16. The circuit of claim 11, wherein each said multivibrator circuit consists essentially of a flip-flop circuit.

17. An integrated circuit, configured to store a lock signal status, comprising:
a plurality of bistable circuits,
each said bistable circuit having at least one respective data input terminal and at least one respective data output terminal;
wherein said data input terminals of all of said bistable circuits are coupled together;
wherein said data output terminals of all of said bistable circuits are coupled together;
wherein all of said bistable circuits are located in respective mutually remote locations including at least two different corners of said integrated circuit chip; and
wherein at least one of said bistable circuits is located near a data storage circuit.

18. The integrated circuit of claim 17, wherein each of said bistable circuits has both first and second data input terminals, and wherein all of said first input terminals are coupled together and all of said second input terminals are coupled together.

19. The integrated circuit of claim 18, wherein said first data input terminal, of each of said bistable circuits, is a set input terminal, and wherein said second input terminal, of each of said bistable circuits, is a reset input terminal.

20. The integrated circuit of claim 17, wherein each of said bistable circuits also has a second output terminal, and wherein all of said second output terminals are coupled together.

21. The integrated circuit of claim 17, wherein at least one of said plurality of bistable circuits is located on said integrated circuit chip in the vicinity of a data storage circuit.

22. The integrated circuit of claim 17, wherein each said bistable circuit consists essentially of a latch circuit.

23. The integrated circuit of claim 17, wherein each said bistable circuit consists essentially of a flip-flop circuit.

* * * * *